United States Patent [19]

Henley

[11] Patent Number: 4,588,950
[45] Date of Patent: May 13, 1986

[54] TEST SYSTEM FOR VLSI DIGITAL CIRCUIT AND METHOD OF TESTING

[75] Inventor: Francois J. Henley, Mountain View, Calif.

[73] Assignee: Data Probe Corporation, Santa Clara, Calif.

[21] Appl. No.: 552,089

[22] Filed: Nov. 15, 1983

[51] Int. Cl.$^4$ .............................................. G01R 31/28
[52] U.S. Cl. .............................. 324/158 R; 307/350; 324/158 T
[58] Field of Search ........... 324/158 D, 158 R, 158 T; 307/530, 352, 353; 328/151

[56] References Cited

U.S. PATENT DOCUMENTS

| 4,242,635 | 12/1980 | Burns | 324/158 R |
| 4,287,441 | 9/1981 | Smith | 307/353 |

FOREIGN PATENT DOCUMENTS 58-76910  5/1983  Japan .................................... 307/353

OTHER PUBLICATIONS

Peterson, R., "High Performance Integrated Circuits for High-Gain FM-IF Systems", IEEE Trans. Broadcast & Tele. Rcvrs., vol. 16, No. 4, Nov. 1970, pp. 257-263.

McMahon, R., "A Laser Scanner for Integrated Circuit Testing", Proc. 1972 Int'l. Reliability Physics Symp., pp. 23-25.

*Primary Examiner*—Jerry W. Myracle
*Assistant Examiner*—Stephen M. Baker
*Attorney, Agent, or Firm*—Flehr, Hohbach, Test, Albritton & Herbert

[57] ABSTRACT

The conductive state of a transistor in a semiconductor integrated circuit is determined by irradiating the transistor with a radiation beam and measuring changes in load current, thereby indicating whether the transistor was conducting or non-conducting prior to irradiation. A correlated double sampling method is employed in measuring changes in load current. A load resistor in series with the device under test is capacitively coupled to a differential amplification means including a plurality of differential amplifiers with buffers connected between successive amplifiers. A system clock is stopped at a predetermined time period prior to irradiating the transistor. A bypass switch shunts the load resistor until the clock is stopped.

7 Claims, 6 Drawing Figures

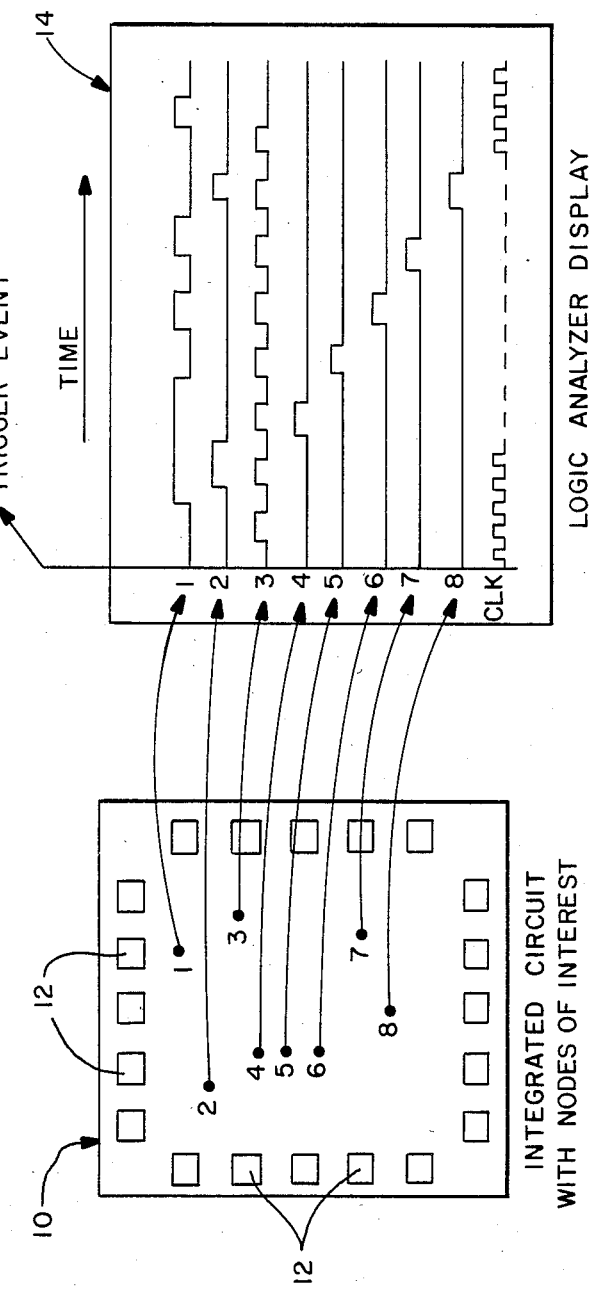
FIG.—1

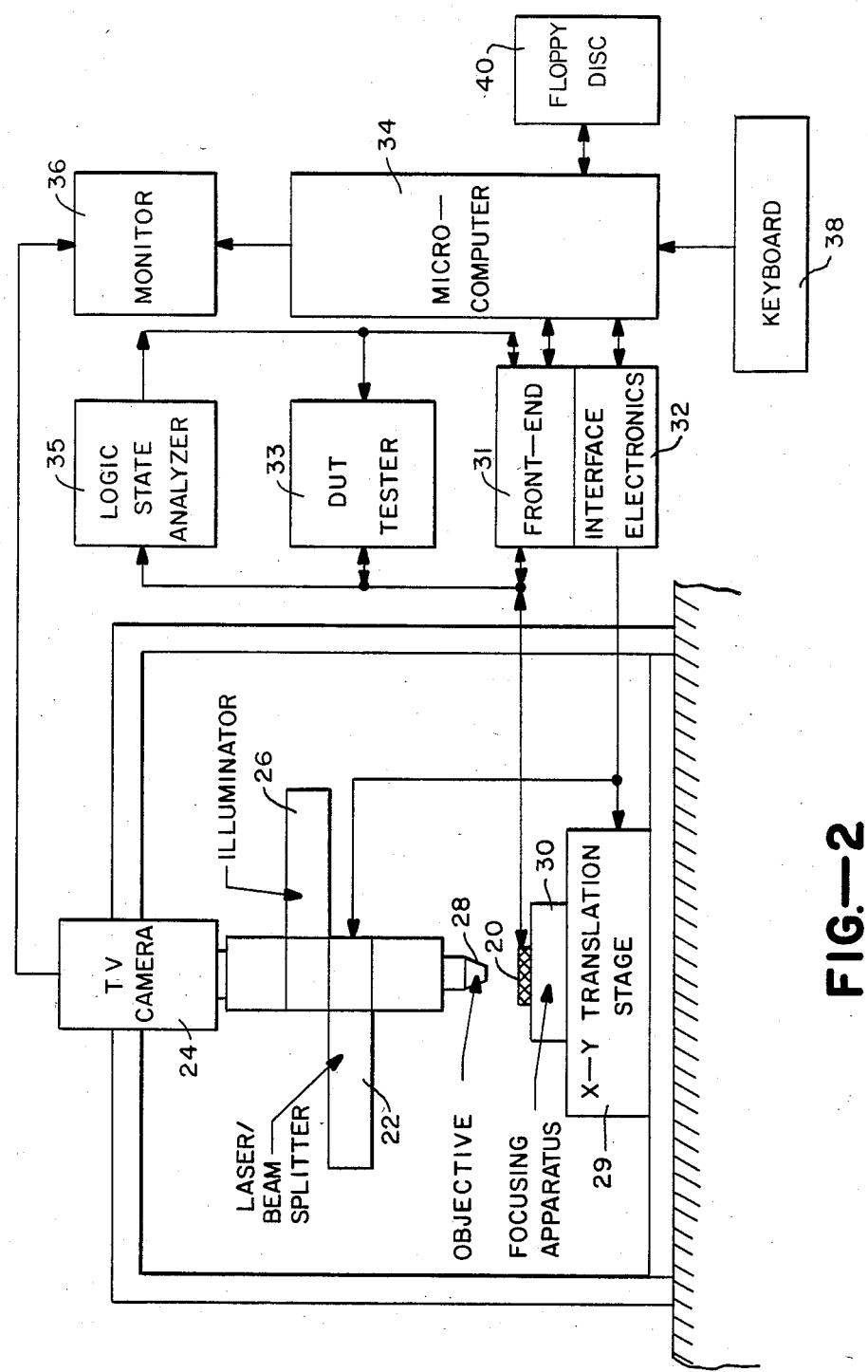
FIG.—2

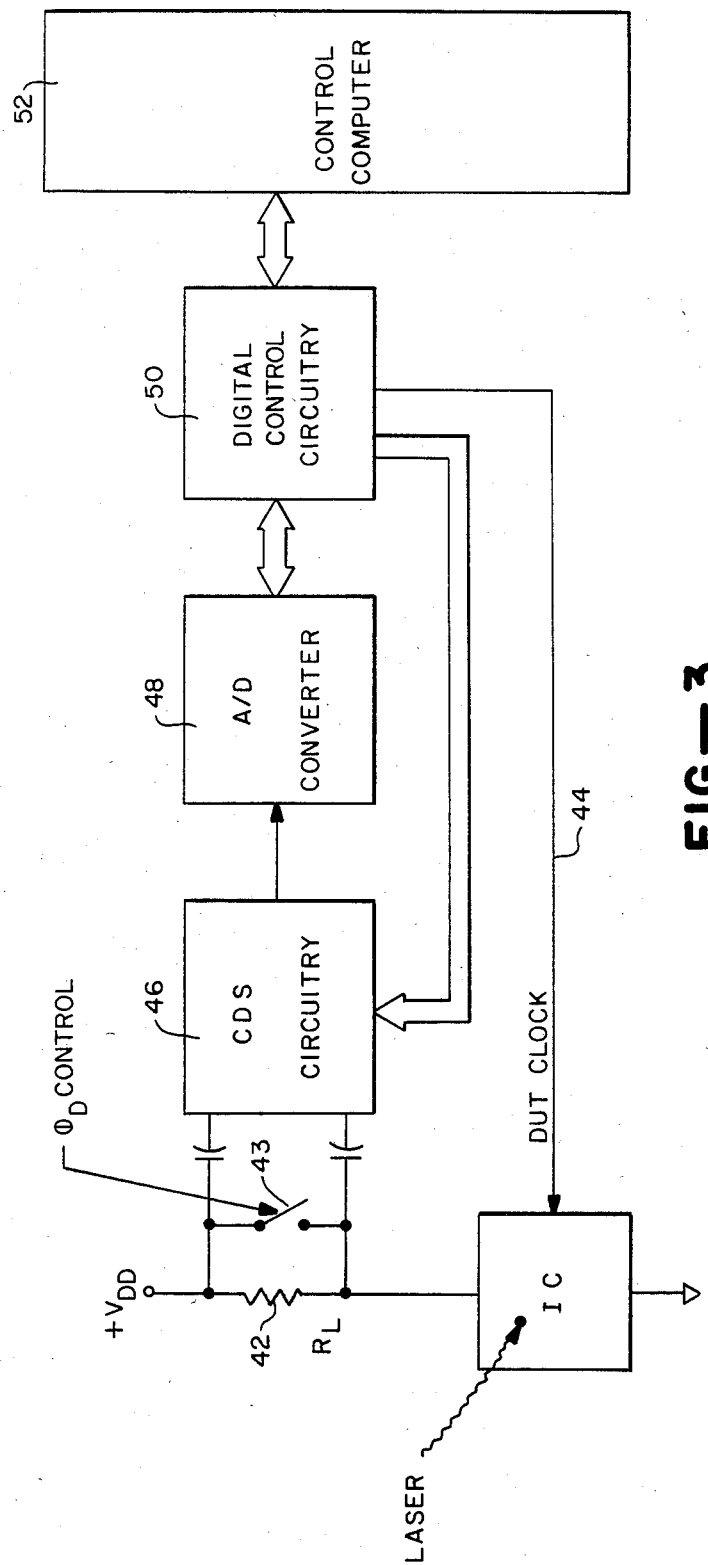
FIG.—3

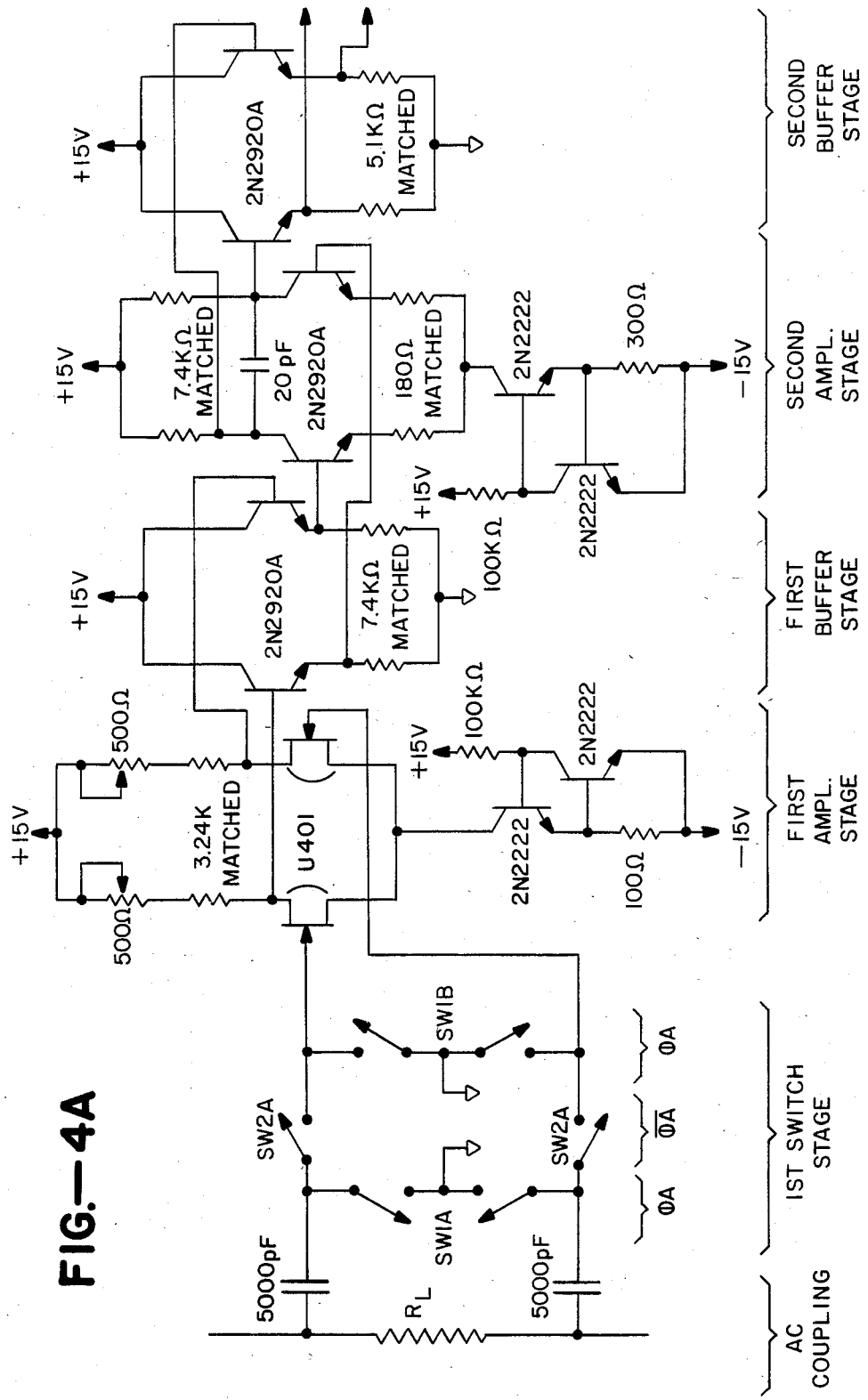
FIG.—4A

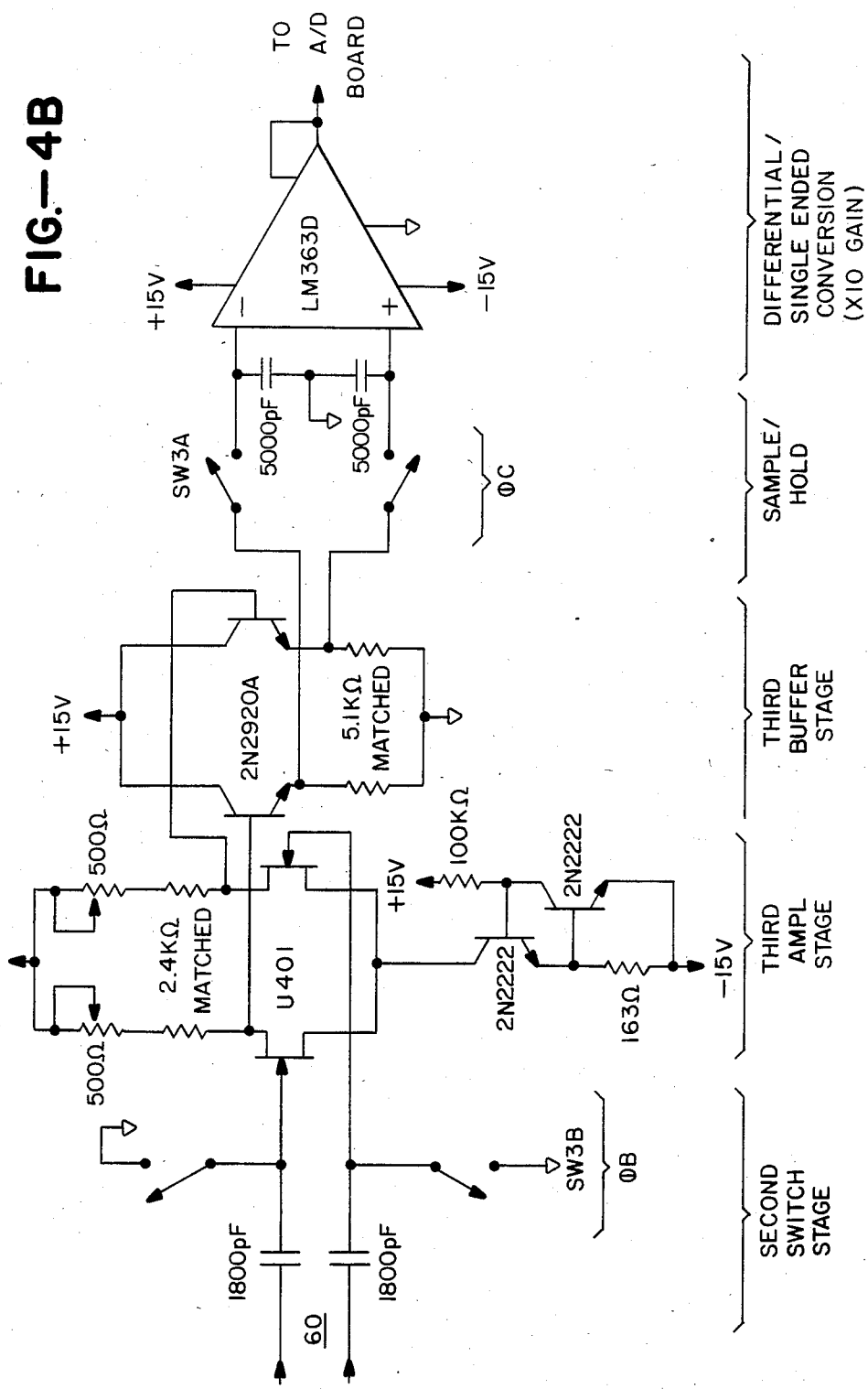

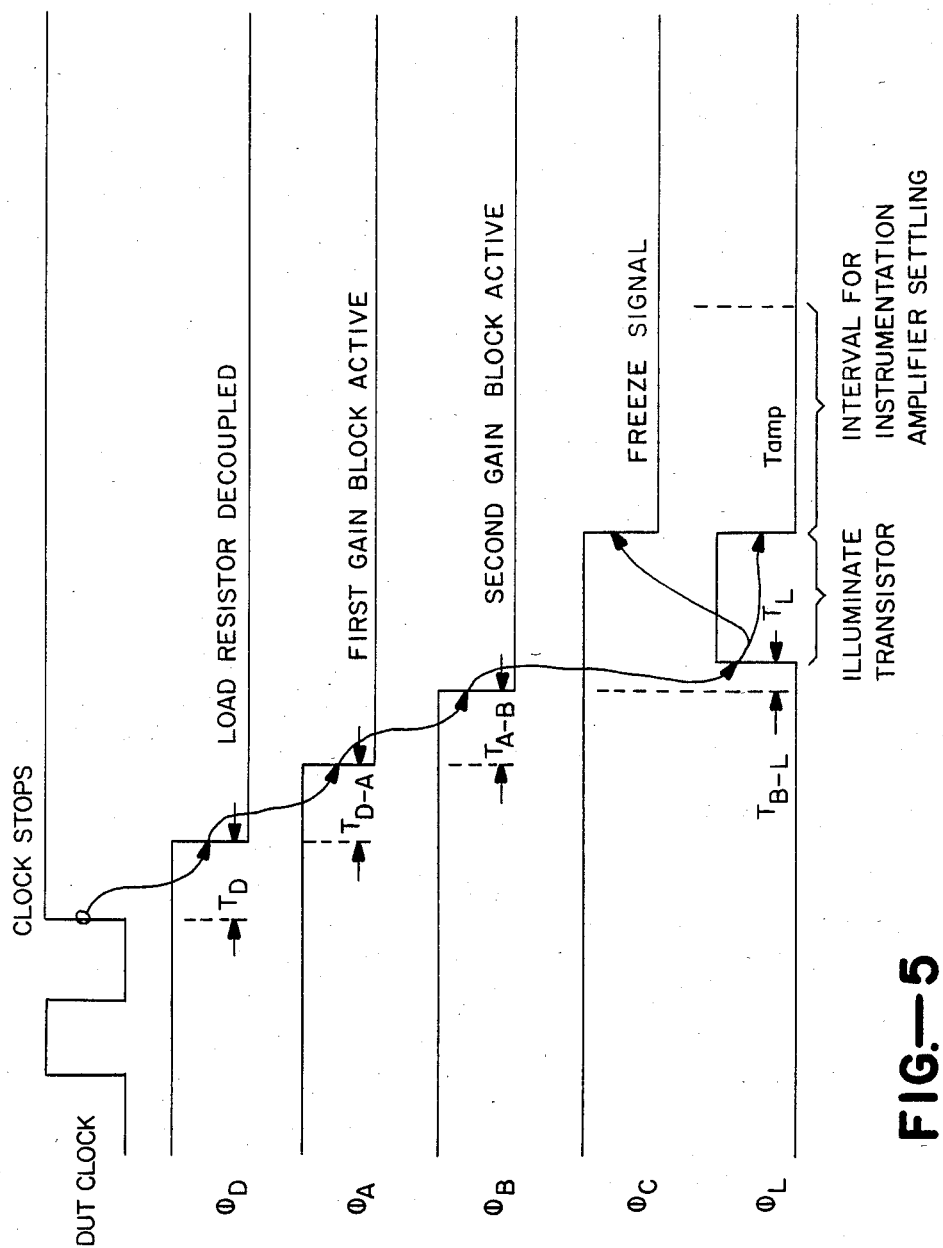

TEST SYSTEM FOR VLSI DIGITAL CIRCUIT AND METHOD OF TESTING

This invention relates generally to test systems for electronic devices, and more particularly the invention relates to the testing of semiconductor integrated circuits.

The testing of semiconductor integrated circuits becomes increasingly difficult as the density of circuit components decreases and the circuit complexity increases. Oftentimes a complex product such as a microprocessor product line has a yield loss because of the product's failure to meet a specified operating frequency. While the product line may function at lower frequencies, a portion of the product line does not operate at the maximum specification frequency. It is important that the circuit designers find the slowest part of a device in order to modify the layout and upgrade product yield.

Such problems are usually hard to find. The input-output pins of a microprocessor can only flag the occurrence of an error within a few instructions or at best within one instruction since a logic error occurring at a particular state may take many instructions to become detectable at an outside pin. Therefore, it is imperative to test a plurality of nodes within the circuit at different clock periods during the execution of an instruction or group of instructions. A knowledgeable test engineer can usually isolate a faulty instruction or set of instructions, and from circuit diagrams the engineer can mark locations of the key nodes of interest on a layout.

One method heretofore proposed for testing nodes of a complex digital circuit is through the use of laser die probing. See for example Pronobis and Burns, "Laser Die Probing for Complex CMOS", *Proceedings of the 1982 ISTFA*, pages 178-181, October 1982. As taught therein, the irradiation of a transistor can cause small changes (e.g. microamperes) in the power supply current for the device under test when a non-conducting transistor is irradiated. Thus, the conductive states of selected transistors within the circuit can be determined at specific instances of time. Techniques are also known for testing high speed devices by stopping the clock at a desired period of time in order to check outside pin voltages. See for example U.S. Pat. No. 4,070,565 for a clock controlled circuit tester and U.S. Pat. No. 4,335,457 for the delay/disablement of a clock signal to an integrated circuit under test.

A limitation in such test apparatus lies in the circuitry for detecting the small changes in supply current when an irradiated transistor becomes conductive. The detection of the small microampere current change is compounded by the capacitance associated with the supply voltage bus line. Previous work on laser scanning techniques for integrated circuit characterization suffers from detection sensitivity and speed problems. Pronobis et al, supra, use a dc subtraction process running at a real time of 250 hertz clockrate to distinguish the signal. Obviously this technique cannot work at megahertz speeds because of switching transients. Further, the finite carrier recombination velocity tends to decrease the bandwidth of electrical modulation by light means. Additionally, the finite capacitance of the power supply line acts to further bandwidth limit the signal exiting the chip.

The present invention is directed to a test system employing laser die probing and clock control whereby improved data acquisition is realized when testing a complex integrated circuit at megahertz speeds. The system utilizes analog signal detection with analog to digital conversion for computer processing of the detected data.

A correlated double sampling (CDS) scheme is employed in the analog operation of obtaining the current signal. According to this scheme the analog stage amplifies a differential signal impressed thereon during a time window. The resulting amplified signal is then sent to the analog to digital converter prior to transmission to the system computer. The timing of the CDS amplification sequence is programmable and directly controlled by a digital control section.

Accordingly, an object of the invention is data acquisition means for use in radiation probe testing of an integrated circuit which is free of state transition current transients.

Another object of the invention is data acquisition circuitry which is insensitive to clock frequency.

Still another object of the invention is data acquisition circuitry which is temperature and dc drift insensitive.

Yet another object of the invention is a method of acquiring test data in a complex integrated circuit which performs offset and lends itself to computer signal processing techniques for automatic threshold detection.

A feature of the invention is a capacitively coupled, fully differential detection circuitry which is insensitive to power supply noise.

The objects and features of the invention will be more readily apparent from the following detailed description and appended claims when taken with the drawing, in which:

FIG. 1 is an illustration of nodes within an integrated circuit and the logic states thereof.

FIG. 2 is a functional block diagram of an integrated circuit test system in accordance with the invention.

FIG. 3 is a functional block diagram of the electronics portion of the system of FIG. 2 including the analog circuitry for providing a correlated double sampling of supply current during testing.

FIGS. 4a and 4b are a detailed schematic of one embodiment of the correlated double sampling circuitry of FIG. 3.

FIG. 5 is a timing diagram illustrating operation of the circuitry of FIG. 4.

Referring now to the drawing, FIG. 1 is an illustration of an integrated circuit shown generally at 10 having a plurality of output pins 12 on the periphery thereof and a plurality of nodes 1-8 within the integrated circuit. In testing the integrated circuits the bit streams at each node during consecutive time periods must be determined, as illustrated by the timing diagram shown generally at 14. The logic state of each of the nodes 1-8 is mapped against the clock signal as illustrated. The timing diagram can be assembled by concatenating the logic levels of succeeding states at each of the nodes. The diagram will then yield information about the dynamic and logic operation of the circuit.

FIG. 2 is a functional block diagram of a test system in accordance with the present invention. The device under test (DUT) 20 is provided on an X-Y translation table with an optics portion positioned generally thereabove. The optics portion includes a laser/beam splitter 22, a TV camera 24 for viewing the DUT, and an illuminator 26. Each of the devices 22-26 is focused on the DUT by means of an objective lens 28. The TV camera allows the user to aim a laser spot on the node of interest. The light illuminator 26 illuminates the DUT field of interest for the TV camera, and the illuminator is turned off during the actual test. The laser/beam splitter injects the laser beam into the optics, and the objective lens focuses the laser beam and reduces the field of view for the camera. Focusing apparatus 30 allows the user to focus the surface of the DUT.

Front end and data acquisition circuitry 32 operates under computer control and is triggered by the hardware logic state analyzer. This circuitry extracts the current values at the proper states and sends the values to the computer 34 for analysis. Computer 34 directs all activities of the other components to acquire, display, and store a generated timing diagram.

The monitor 36 displays the image from TV camera 24 and the computer status, data, and output. A keyboard 38 allows the user to control and feed test parameters into the test system, and floppy discs 40 are provided for the permanent storage of timing diagrams and test vectors.

FIG. 3 illustrates generally the correlated double sampling (CDS) method of obtaining data. The supply voltage, $V_{DD}$, is connected through a load 42 to the integrated circuit 20 device under test. Load 42 can be a resistor, as shown, or other suitable load means such as a current mirror, for example. A switch 43 bypasses resistor 42 except due the test procedure. The system clock 44 is allowed to run after a triggering event until a desired time period is reached, whereupon the clock is stopped and a transistor at a particular node under investigation within the integrated circuit 20 is then irradiated by a laser beam as illustrated. If the transistor is already conducting, the increase in load current will be much less than if the transistor is non-conducting before illumination. The change in node current is monitored by the double sampling technique in which the voltage at either end of the load resistor 42 is capactively coupled to the analog circuitry shown generally at 46. The analog circuitry includes several amplification stages 40 which amplify the differential voltage impressed upon it during the desired time window when the clock 44 is stopped. The resulting amplified signal is then sent to an analog to digital converter, 48, and a digital signal is then transmitted through the control circuitry 50 to computer 52. The control circuitry 50 provides the clock signals ($\emptyset_D, \emptyset_A, \emptyset_B, \emptyset_C,$) for controlling the CDS circuitry 46 during the data acquisition, as will be described with reference to FIGS. 4 and 5.

FIG. 4 is a detailed schematic of one embodiment of the CDS circuitry 46 of FIG. 3. The circuitry provides capacitively coupled fully differential gain for a measured signal with temperature and dc drift insensitivity, and low noise. As noted, the circuitry includes a capacitive ac coupling stage, a switch stage for transient suppression and operating point reset, a first amplification stage, a first buffer, a second amplification stage, a second bipolar buffer, a second switch stage for eliminating charge injection noise and negation of drift and offset, a third amplification stage, a third bipolar buffer, and sample and hold circuitry followed by differential/single ended conversion of the amplified signal which is then connected to the A/D circuitry.

FIG. 5 illustrates the clock signals provided by the digital control circuitry 50 of FIG. 3 in controlling data acquisition by the CDS circuitry.

Either end of the load resistor or $R_L$ is capacitively coupled to the first gain stage which eliminates the dc component of the integrated circuit supply current from the measurement. Independent biasing of the first gain stage is also permitted. The analog switches of the first switch stage perform the current transient suppression by isolating the sensitive analog circuits when the integrated circuit is operating and reset the gain stage operating point to ground. When the integrated circuit is operating, SW1A and SW1B are closed and SW2A is open. The gain section is therefore isolated and set to ground.

When $\emptyset A$ fires, SW1A and SW1B of the first switch stage opens while SW2A closes. This action disconnects the reference and connects the sense lines to the gain stage. The gain stage becomes active and amplifies sense line voltage changes. The particular arrangement cancels charge injection from switch transients.

The minimum settling time for transient suppression is dominated by the RC time constant of the coupling capacitors and the SW1A switch on-resistance. By allowing six time constants for transient relaxation, the settling time before connection should then be greater than 900 nanoseconds.

The first gain block consists of two gain stages and two buffer stages. The first amplifier stage is a high input impedance low-noise FET common-source stage. To avoid loading its output and thus reduce its bandwidth, a bipolar buffer stage is placed between the FET first amplifier stage and the bipolar second amplifier stage.

With a FET stage gain of approximately 13 and a bipolar second stage (common-emitter) gain of approximately 35, the overall block gain is about 455. The amplification of the bipolar gain section is purposely reduced with emitter shunting resistors to increase its bandwidth. The 20 pF capacitor across the collectors lowers the 3 dB frequency point for high frequency noise reduction. Finally a bipolar second buffer stage performs an impedance conversion to isolate the bipolar second amplifier stage from the second gain block.

Two 1800 pF capacitors 60 and a SW3B switch of the second switch stage perform an AC coupling/operating point reset. This circuitry eliminates prior device mismatches, offsets, and temperature drifts. It also eliminates the amplified charge injection noise of the first switch stage. The elimination is possible by firing $\emptyset B$ some time after $\emptyset A$ so that the error transients become DC voltage offsets across the capacitors 60. The transients will therefore not produce any differential signal in the second gain block.

The second gain block consists of a FET common-source high impedance third amplifier stage, a bipolar third buffer for sample and hold capacitor drive capability, a sample/hold switch SW3A, sample and hold capacitors 62, and an instrumentation amplifier providing a differential/single ended conversion. Once the amplified signal appears across the 5000 pF precision holding capacitors 62, $\emptyset C$ fires to open SW3A and isolate the signal from the front-end circuitry. This differential signal will be amplified further by the instrumentation amp for transmission into the A/D converter circuit. The total gain for the front-end circuit is 35,000. With a 20 ohm IC load resistor, the current to voltage gain is thus 700 KV/A.

Upon completion of a measurement, the test apparatus is reinitialized to the start of the test program and the clock is again started. The control computer or digital control circuitry issues parameters for a new measurement. One parameter is a binary number representing the number of clock cycles allowed to pass after the trigger event before again stopping the clock for the new measurement. Accordingly, any desired state for measurement is determined by setting a state counter. Since the measurement scheme arrives at the state of interest at the device clock rate, the logic level of the transistor at that state will reflect high speed operation of the device under test.

One problem can be encountered when employing the correlated double sampling. A droop can occur in the current baseline which can shift the sampled voltages upwards or downwards. A cancellation of any droop can be effected by taking two successive state readings, one without laser irradiation and one with the irradiation. By subtracting the two readings, the droop is cancelled and the residual represents the true signal resulting from application of the laser.

A test system employing the correlated double sampling in accordance with the invention allows a nearly constant AC baseline free of state transition current transients. Because of the capacitively coupled fully differential detection scheme, the measurements are first order insensitive to power supply noise and to the integrated circuit current dissipation level. Only the relative data is measured thus the detection circuit does not require high dc and temperature stability.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A method of testing the conductive state of a transistor in a high speed semiconductor integrated circuit comprising the steps of
    applying electrical power through load means and bypass switch means to said integrated circuit,
    applying a clock signal to said integrated circuit,
    stopping said clock signal at a predetermined time period,
    opening said bypass switch means so that current flows through said load means,
    irradiating said transistor with a focused radiation beam, and
    measuring change in current applied to said integrated circuit by correlated double sampling whereby voltages at either end of said load means are capacitively coupled to differential amplification means, said measuring change including measuring current without irradiating said transistor to obtain a first measurement, measuring current while irradiating said transistor to obtain a second measurement, and subtracting said first measurement from said second measurement.

2. The method as defined by claim 1 and further including the step of converting an amplified analog signal from said differential amplification means to a digital signal.

3. The method as defined by claim 1 wherein said step of irradiating includes applying a focused laser beam on said transistor.

4. Test apparatus for high speed logic state analysis by determining the conduction state of a transistor in a digital semiconductor integrated circuit operating at a clock rate in excess of one megahertz comprising
    power supply means,
    load means connecting said power supply means with a semiconductor integrated circuit undergoing test,
    switch means for electrically bypassing said load means,
    laser means for selectively irradiating a transistor in said semiconductor integrated circuit,
    clock means for applying a clock signal to said semiconductor integrated circuit,
    differential amplification means,
    capacitive means for capacitively coupling said load means to said differential amplification means, and
    control means for stopping said clock means at a predetermined state time, deactivating said switch means for bypassing said load means, thereafter irradiating a transistor in said semiconductor integrated circuit, and differentially amplifying the voltage across said load means.

5. Test apparatus as defined by claim 4, wherein said differential amplification means includes a plurality of amplifier stages with buffer means interconnecting successive amplifier stages.

6. Test apparatus as defined by claim 5 and further including analog to digital conversion means for converting an amplified analog voltage from said load resistor to a digital signal.

7. Test apparatus as defined by claim 4 wherein said load means comprises a resistor.

* * * * *